United States Patent
Nishitani

(10) Patent No.: US 9,934,926 B2
(45) Date of Patent: Apr. 3, 2018

(54) ACTIVATION CHAMBER, KIT USED IN TREATMENT DEVICE AND TREATMENT DEVICE, FOR LOWERING ELECTRON AFFINITY

(71) Applicant: NATIONAL UNIVERSITY CORPORATION NAGOYA UNIVERSITY, Aichi (JP)

(72) Inventor: Tomohiro Nishitani, Nagoya (JP)

(73) Assignee: NATIONAL UNIVERSITY CORPORATION NAGOYA UNIVERSITY, Aichi (JP)

( * ) Notice: Subject to any disclaimer, the term of this patent is extended or adjusted under 35 U.S.C. 154(b) by 0 days.

(21) Appl. No.: 14/904,945

(22) PCT Filed: Jun. 12, 2014

(86) PCT No.: PCT/JP2014/065606
§ 371 (c)(1),
(2) Date: Jan. 13, 2016

(87) PCT Pub. No.: WO2015/008561
PCT Pub. Date: Jan. 22, 2015

(65) Prior Publication Data
US 2016/0172144 A1    Jun. 16, 2016

(30) Foreign Application Priority Data
Jul. 16, 2013   (JP) .............................. 2013-147682

(51) Int. Cl.
*H01J 1/34* (2006.01)
*H01J 37/06* (2006.01)
*H01J 37/073* (2006.01)

(52) U.S. Cl.
CPC ............... *H01J 1/34* (2013.01); *H01J 37/06* (2013.01); *H01J 37/073* (2013.01); *H01J 2237/06333* (2013.01); *H01J 2237/2602* (2013.01)

(58) Field of Classification Search
None
See application file for complete search history.

(56) References Cited

U.S. PATENT DOCUMENTS

| | | | | |
|---|---|---|---|---|
| 4,620,132 | A * | 10/1986 | Gordon | H01L 31/145 257/E31.1 |
| 2003/0076865 | A1 * | 4/2003 | Chang-Hasnain | B82Y 20/00 372/46.01 |

(Continued)

FOREIGN PATENT DOCUMENTS

| | | |
|---|---|---|
| JP | H09298032 A | 11/1997 |
| JP | 2002008575 A | 1/2002 |

(Continued)

OTHER PUBLICATIONS

Naoto Yamamoto et al "High britghtness and highpolarization . . ." J App Phys 103 064905 2008.*

(Continued)

*Primary Examiner* — Douglas W Owens
*Assistant Examiner* — Srinivas Sathiraju
(74) *Attorney, Agent, or Firm* — McDermott Will & Emery LLP

(57) ABSTRACT

The present disclosure provides a treatment device for lowering electron affinity. The treatment device is capable of performing an electron affinity (EA) surface treatment on a photocathode material or an EA surface retreatment on a photocathode. The present disclosure also provides an electron-beam device provided with the treatment device. An activation chamber is used in a treatment device for lowering electron affinity by vaporizing a surface-treatment mate- (Continued)

rial and uses the vaporized surface-treatment material to perform an electron-affinity lowering treatment on a photocathode material or an electron-affinity lowering retreatment on a photocathode. The activation chamber includes one or more holes through which electrons can pass.

27 Claims, 16 Drawing Sheets

(56) References Cited

U.S. PATENT DOCUMENTS

| | | | | |
|---|---|---|---|---|
| 2005/0253069 | A1* | 11/2005 | Zewail | H01J 37/065 250/311 |
| 2006/0152833 | A1* | 7/2006 | Halls | B82Y 10/00 359/883 |
| 2010/0108983 | A1* | 5/2010 | Nishitani | H01J 1/34 257/10 |
| 2010/0118377 | A1* | 5/2010 | Haberfelde | G02F 1/015 359/263 |
| 2011/0089397 | A1* | 4/2011 | Ujihara | G21K 1/16 257/11 |
| 2015/0243826 | A1* | 8/2015 | An | H01L 31/028 250/200 |
| 2016/0041095 | A1* | 2/2016 | Rothberg | G01N 21/6408 506/4 |
| 2016/0172144 | A1* | 6/2016 | Nishitani | H01J 37/06 315/5 |

FOREIGN PATENT DOCUMENTS

| | | |
|---|---|---|
| JP | 2003-045368 A | 2/2003 |
| JP | 2009266809 A | 11/2009 |
| JP | 2010182466 A | 8/2010 |
| JP | 2011-150882 A | 8/2011 |

OTHER PUBLICATIONS

Togawa et al "Surface charge limit in NEA . . ." Nuclear Ins and Methods in Physics Research A 414 (1998) 431-445.*
R alley et al "Standford linea accelerator . . ." Nuclear instru..phys research A 365 (1995) 1-27.*
Kuwahara M. et al., "30-kV spin-polarized transmission electron microscope GaAs—GaAsP strained superlattice photocathode", Applied Physics Letters, vol. 101, No. 3, Jul. 16, 2012, 4 pgs.
Extended European Search Report issued in European Patent Application No. 14826750.3, dated May 18, 2016.
MRS-J News vol. 20, May 2008 (partial, English translation of drawings provided).
International Search Report dated Sep. 16, 2014, received in related International Application No. PCT/JP2014/065606, filed Jun. 12, 2014 (translation is provided).

* cited by examiner

ACTIVATION CHAMBER, KIT USED IN TREATMENT DEVICE AND TREATMENT DEVICE, FOR LOWERING ELECTRON AFFINITY

CROSS-REFERENCE

This application is the U.S. National Phase under 35 U.S.C. § 371 of International Application No. PCT/JP2014/065606, filed Jun. 12, 2014, which claims the benefit of Japanese Application No. 2013-147682, filed Jul. 16, 2013, the entire contents of each are hereby incorporated by reference.

BACKGROUND OF THE INVENTION

1. Field of the Invention

The present invention relates to an activation chamber and a kit used in a treatment device for lowering electron affinity; a treatment device containing the kit and used to lower electron affinity; a photocathode electron-beam source; an electron gun containing a photocathode electron-beam source; a free-electron laser accelerator containing a photocathode electron-beam source; a transmission electron microscope containing a photocathode electron-beam source; a scanning electron microscope containing a photocathode electron-beam source; an electron-beam holography microscope containing a photocathode electron-beam source; an electron-beam lithography device containing a photocathode electron-beam source; an electron-beam diffraction device containing a photocathode electron-beam source; and an electron-beam scanning device containing a photocathode electron-beam source; and relates in particular to an activation chamber used in a treatment device for lowering electron affinity, treatment to lower the electron affinity of a photocathode material, and treatment to again lower the electron affinity of a photocathode, can be carried out repeatedly within a single vacuum chamber without the need to separately furnish a vacuum chamber for treatment to lower the electron affinity of a photocathode material and treatment to again lower the electron affinity of a photocathode material, and an electron-beam source chamber in which a photocathode is arranged and emits electrons, as in the prior art, and with which emission of electrons can be carried out; a treatment device containing the kit and used to lower electron affinity; a photocathode electron-beam source; an electron gun containing a photocathode electron-beam source; a free-electron laser accelerator containing a photocathode electron-beam source; a transmission electron microscope containing a photocathode electron-beam source; a scanning electron microscope containing a photocathode electron-beam source; an electron-beam holography microscope containing a photocathode electron-beam source; an electron-beam lithography device containing a photocathode electron-beam source; an electron-beam diffraction device containing a photocathode electron-beam source; and an electron-beam scanning device containing a photocathode electron-beam source.

2. Description of the Related Art

To date, electron-beam sources that utilize GaAs semiconductor photocathodes (GaAs photocathode electron-beam sources) have contributed to the field of accelerator science, as sources for spin-polarized electron beams having high polarization, in elementary particle/hadron physics experiments (precision measurement of Weinberg angle), or as high-brightness electron-beam sources capable of high-repetition short pulses of a high-current beam to generate a 1 kW infrared free-electron laser, and the like.

Further, GaAs photocathode electron-beam sources are strong candidates as high brightness electron-beam sources capable of producing a low-emittance (the area occupied by the beam within phase space) high-current beam for use in next-generation radiation source accelerators, and according to the "International Linear Collider Project," which is a future project for a linear, next-generation accelerator to help unravel the mysteries behind the creation of the universe, are considered as the sole practical high-performance spin-polarized electron sources.

Meanwhile, together with detailed structural analysis and elemental analysis on an atomic scale, intra-structural measurements of electrical and magnetic characteristics are considered crucial for the purposes of miniaturization of semiconductor devices and development of advanced functional materials. Next-generation observation and measurement techniques that exceed existing capabilities will be needed to meet this demand, and development of high-capability electron-beam sources, which is an elemental technique, will be crucial in this regard. GaAs photocathode electron-beam sources are viewed as powerful candidates as electron-beam sources for use in next-generation electron microscopes, due to their high-repetition rate and short pulse width, high brightness, and high spin polarization capabilities.

A GaAs photocathode electron-beam source utilizes a negative electron affinity (hereinafter sometimes denoted as "NEA") surface (a state in which the vacuum level is below the bottom of the conduction band). By utilizing an NEA surface, electrons that have been photoexcited from the valence band to a potential level at the bottom of the conduction band can be output as-is into a vacuum as an electron beam. FIG. 1 shows the concept of generating an electron beam from a GaAs photocathode electron-beam source, and can be explained in terms of the phenomenology of the three-step model: (1) excitation, (2) scattering, and (3) escape, described next. (See non-patent document 1)

(1) Excitation light impinges on a photocathode, exciting valence band electrons into the conduction band (excitation).

(2) The electrons excited into the conduction band scatter to the surface (scattering).

(3) Electrons reaching the surface tunnel through the surface barrier and escape into the vacuum (escape).

A GaAs semiconductor has electron affinity (the energy differential between the vacuum level and the conduction band bottom) of about 4 eV, and the following process is necessary to form an NEA surface state.

(1) First, a p-type doped GaAs semiconductor is heated in a vacuum, and surface impurities such as oxides and carbides are removed to clean the surface. In so doing, band bending is produced in a surface region, and the vacuum level is lowered to about half the bandgap ($\varphi_B$) of the semiconductor.

(2) Next, as shown in FIG. 2, in order to obtain a very small photocurrent on the crystal surface, first, cerium is vapor deposited thereon, and then cesium deposition and oxygen addition are repeated alternately until maximum photocurrent is obtained, for each saturation of photocurrent. By lowering the remaining vacuum level ($\varphi_D$) by this method, an NEA surface state can be formed (see Non-Patent Document 1).

The NEA surface state refers to a state in which, through the aforedescribed process, the energy level of the vacuum level of the photocathode is brought to a state lower than the energy level of the conduction band bottom. However, electrons can be emitted into a vacuum even when the energy level of the vacuum level of the photocathode is higher than the energy level of the conduction band bottom. Moreover, even after treatment to bring the photocathode to the NEA surface state, continued emission of electrons may in some cases lead to electrons being emitted while the energy level of the vacuum level of the photocathode returns to a high level from a level lower than the energy level of the conduction band. Consequently, in cases in which the photocathode is used as an electron-beam source, it is preferable to lower the energy level of the vacuum level of the photocathode to the greatest extent possible; however, it is not essential to bring about or maintain the NEA surface state. Accordingly, in the present invention, "treatment to lower electron affinity" refers to a treatment to lower the energy level of the vacuum level of the photocathode to a level at which electrons can be emitted. Herein, "treatment to lower electron affinity" is sometimes referred to as "EA surface treatment," and a state in which, through "treatment to lower electron affinity," the energy level of the vacuum level of the photocathode has been lowered to a level at which electrons can be emitted, as an "EA surface."

An EA surface is degraded by adsorption of trace amounts of $H_2O$, CO, $CO_2$, or other residual gases, or by backflow of ionized residual gases onto the EA surface. For this reason, in order to stably output an electron beam from a photocathode for an extended period, an ultrahigh degree of vacuum is necessary for treatment and maintenance. Moreover, the quantity of electrons output by an EA surface-treated photocathode is finite, and once a given quantity of electrons has been emitted, it is necessary to again subject the photocathode surface to EA surface treatment.

FIG. 3 is an entire photo of an electron gun 10 that uses a conventional EA surface-treated photocathode. The electron gun 10 includes at least an EA surface treatment chamber 11, an electron gun chamber 12, and transport means 13 for the EA surface-treated photocathode. As described above, it is necessary for the EA surface-treated photocathode to be loaded into the electron gun without being exposed to the outside air while continuing to maintain an ultrahigh vacuum state after carrying out EA treatment in an ultrahigh vacuum. Additionally, once a given time period has passed, it is necessary to repeat the EA surface treatment of the photocathode, and in the prior art, it was necessary to furnish an EA surface treatment chamber and an electron gun chamber separately. The reason was that in conventional EA surface treatment there is adopted a method involving vapor deposition of a surface treatment material directly onto the photocathode inside a chamber, but when EA surface treatment is carried out in the same chamber, the EA surface treatment material is deposited onto the electron gun chamber and various devices inside the chamber, and EA surface treatment material deposited near the electrodes in particular can lead to the occurrence of field emission dark current, dramatically lowering the capability of the electron gun.

However, in cases in which the EA surface treatment chamber and the electron gun chamber are furnished separately, firstly, two chambers brought to an ultrahigh vacuum state are needed; and further, the transport means 13 is needed to transport the photocathode treated in the EA surface treatment chamber into the electron gun chamber while continuing to maintain the ultrahigh vacuum state, leading to the problem that the electron gun device becomes extremely large. Moreover, because it is necessary for the EA surface-treated photocathode to be moved from the EA surface treatment chamber to the electron gun chamber and installed therein while maintaining an ultrahigh vacuum, and also to be moved from the EA surface treatment chamber to the electron gun chamber and installed therein during EA surface re-treatment of the photocathode, the device must be designed precisely, and proper manipulation of the photocathode is necessary to avoid dropping it during transport, leading to the problem of complicated device management. [Non-Patent Document 1] MRS-J NEWS, Vol. 20, No. 2, May 2008

SUMMARY OF THE INVENTION

The present invention is an invention made for the purpose of solving the aforedescribed problems. Painstaking research led to the new discoveries that EA surface treatment can be accomplished by furnishing an activation chamber within a chamber that can be brought to an ultrahigh vacuum state, and vaporizing a surface treatment material within the activation chamber, then vapor-depositing the vaporized surface treatment material onto a photocathode material within the activation chamber; further, that by EA surface re-treatment of a photocathode using the chamber once a given time period has passed, EA surface treatment of the photocathode material and EA surface re-treatment of the photocathode material (herein, "EA surface treatment of the photocathode material and EA surface re-treatment of the photocathode material" is sometimes denoted as "EA surface treatment," and cases in which either "photocathode material" or "photocathode" is applicable are sometimes denoted by "photocathode (material)") can be accomplished while employing a single vacuum chamber.

The present invention was then perfected based on the novel discovery that when a hole through which electrons can pass is formed in the activation chamber, and the EA surface-treated photocathode is irradiated with light while still arranged in the activation chamber, electrons can be emitted through the hole formed in the activation chamber, and therefore a single vacuum chamber can be employed to produce an electron-beam source, and that the electron-beam source of the present invention can be employed as an electron-beam source for devices of various kinds, such as an electron gun.

Specifically, an object of the present invention is to provide an activation chamber and a kit used in a treatment device for lowering electron affinity; a treatment device containing the kit and used to lower electron affinity (herein sometimes referred to simply as a "treatment device"); a photocathode electron-beam source; an electron gun containing a photocathode electron-beam source; a free-electron laser accelerator containing a photocathode electron-beam source; a transmission electron microscope containing a photocathode electron-beam source; a scanning electron microscope containing a photocathode electron-beam source; an electron-beam holography microscope containing a photocathode electron-beam source; an electron-beam lithography device containing a photocathode electron-beam source; an electron-beam diffraction device containing a photocathode electron-beam source; and an electron-beam scanning device containing a photocathode electron-beam source.

The present invention relates to an activation chamber and a kit used in a treatment device for lowering electron affinity; a treatment device; a photocathode electron-beam source; an electron gun containing a photocathode electron-beam source; a free-electron laser accelerator containing a photocathode electron-beam source; a transmission electron microscope containing a photocathode electron-beam source; a scanning electron microscope containing a photocathode electron-beam source; an electron-beam holography microscope containing a photocathode electron-beam source; an electron-beam lithography device containing a photocathode electron-beam source; an electron-beam diffraction device containing a photocathode electron-beam source; and an electron-beam scanning device containing a photocathode electron-beam source, which are shown below.

(1) An activation chamber for use in an electron-affinity-lowering treatment device for vaporizing a surface treatment material and using the vaporized surface treatment material to perform a treatment to lower electron affinity on a photocathode material and/or re-treatment to lower electron affinity on a photocathode, wherein the activation chamber includes a hole through which electrons can pass.
(2) The activation chamber according to (1) above, wherein the activation chamber is formed of a material selected from conductive materials and insulating materials.
(3) The activation chamber according to (1) or (2) above, further comprising drive means for changing the position of a photocathode holder.
(4) The activation chamber according to any one of (1) to (3) above, further comprising direction control means for controlling the dispersion direction of vaporized surface treatment material.
(5) The activation chamber according to any one of (1) to (4) above, further comprising heating means for heating the surface treatment material.
(6) The activation chamber according to any one of (1) to (5) above, further comprising a shield for preventing vaporized surface treatment material from leaking outside the activation chamber.
(7) The activation chamber according to any one of (1) to (6), wherein the hole is large enough to allow the photocathode holder to be inserted therein.
(8) The activation chamber according to any one of (1) to (6) above, further comprising a hole through which light passes.
(9) A kit for use in a treatment device for lowering electron affinity, comprising the activation chamber according to any one of (1) to (8) above, and a surface treatment material.
(10) The kit according to (9) above, wherein the surface treatment material has heating means inserted therein.
(11) The kit according to (9) or (10) above, further comprising a photocathode material or photocathode holder with a photocathode attached.
(12) The kit according to (11) above, further comprising a photocathode rod on which is formed a shield for preventing vaporized surface treatment material from leaking outside the activation chamber.
(13) The kit according to (11) above, further comprising a lid that is slidable with respect to the activation chamber, the photocathode material or photocathode holder with a photocathode attached being formed on the lid.
(14) The kit according to (11) or (12) above, wherein the photocathode holder is fabricated of light-transmissive material or comprises a hole through which light passes.
(15) The kit according to (13) above, wherein the lid and the photocathode holder are fabricated of a light-transmissive material or comprise a hole through which light passes.
(16) The kit according to any one of (11) to (15) above, comprising a substrate between the photocathode material or photocathode, and the photocathode holder, the substrate being fabricated of a light-transmissive material or comprising a hole through which light passes.
(17) A treatment device for lowering electron affinity, comprising the kit according to any one of (9) to (16), a vacuum chamber, and a vacuum pump.
(18) A photocathode electron-beam source comprising the treatment device for lowering electron affinity according to (17) above, an anode, and a light source.
(19) An electron gun comprising the photocathode electron-beam source according to (18) above.
(20) A free-electron laser accelerator comprising the photocathode electron-beam source according to (18) above.
(21) A transmission electron microscope comprising the photocathode electron-beam source according to (18) above.
(22) A scanning electron microscope comprising the photocathode electron-beam source according to (18) above.
(23) An electron-beam holography microscope comprising the photocathode electron-beam source according to (18) above.
(24) An electron-beam lithography device comprising the photocathode electron-beam source according to (18) above.
(25) An electron-beam diffraction device comprising the photocathode electron-beam source according to (18) above.
(26) An electron-beam scanning device comprising the photocathode electron-beam source according to (18) above.

According to the present invention, by arranging, inside a vacuum chamber, an activation chamber that includes a hole through which electrons can pass and that can vaporize a surface treatment material, EA surface treatment can be accomplished using a single vacuum chamber, and the chamber can be used as an electron-beam source, thereby rendering unnecessary the EA surface treatment chamber and the transport means for transporting the photocathode, so that the device can be smaller.

Additionally, as there is no need to transport the photocathode between different vacuum chambers, there is no risk of dropping or damaging the photocathode during transport between vacuum chambers as in the prior art, and ease of manipulation is improved.

It is possible for the activation chamber and kit of the present invention to be set up in the electron gun chamber of a conventional electron gun, and moreover possible for the treatment device to replace a conventional electron gun chamber, whereby the ease of manipulation of an existing electron gun can be improved without purchasing a new electron gun.

Further, the electron-beam source of the present invention can be used as an electron-beam source in existing devices, such as an electron gun, free-electron laser accelerator, transmission electron microscope, scanning electron microscope, electron-beam holography microscope, electron-beam lithography device, electron-beam diffraction device, or electron-beam scanning device, whereby reduction of device scale, improved ease of manipulation, and improved functionality not possible with conventional electron-beam sources can be achieved.

DESCRIPTION OF THE PREFERRED EMBODIMENTS

The activation chamber, kit, treatment device, photocathode electron-beam source, electron gun containing a photocathode electron-beam source, free-electron laser accelerator containing a photocathode electron-beam source, transmission electron microscope containing a photocathode electron-beam source, scanning electron microscope containing a photocathode electron-beam source, electron-beam holography microscope containing a photocathode electron-beam source, electron-beam lithography device containing a photocathode electron-beam source, electron-beam diffraction device containing a photocathode electron-beam source, and electron-beam scanning device containing a photocathode electron-beam source of the present invention will be described in detail below.

Figure 1:
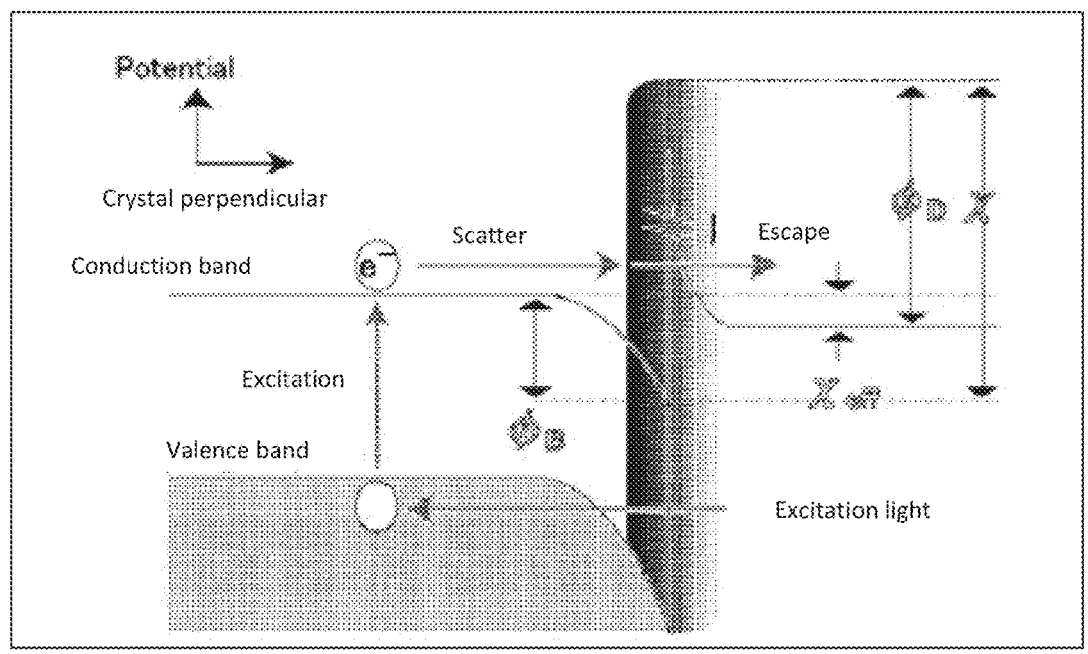
FIG. 1 shows the concept of generating an electron beam from a GaAs photocathode electron-beam source.
Figure 2:
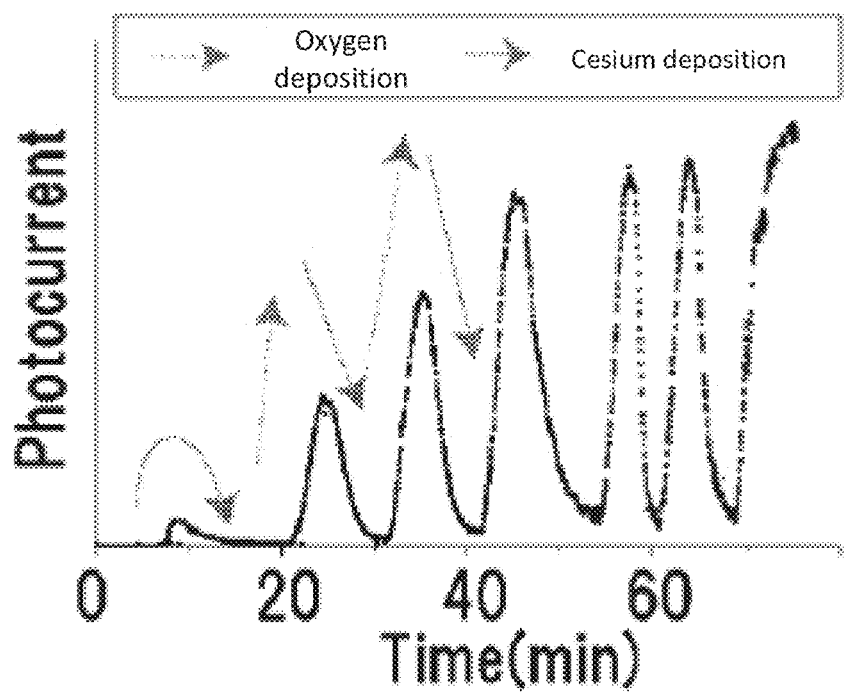
FIG. 2 shows a procedure for forming an EA surface state.
Figure 3:
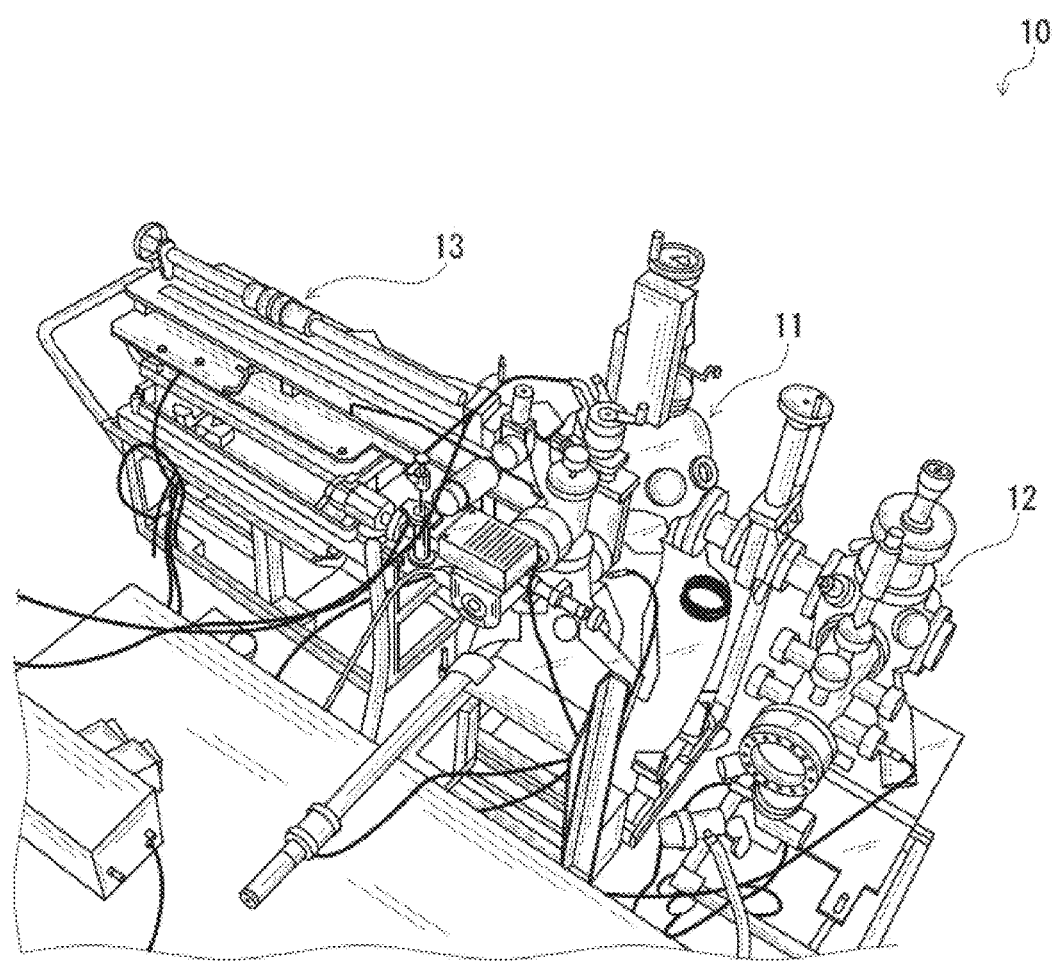
FIG. 3 is a photo in lieu of a drawing, and shows an entire image of an electron gun 10 that uses a conventional EA surface-treated photocathode.
Figure 4:
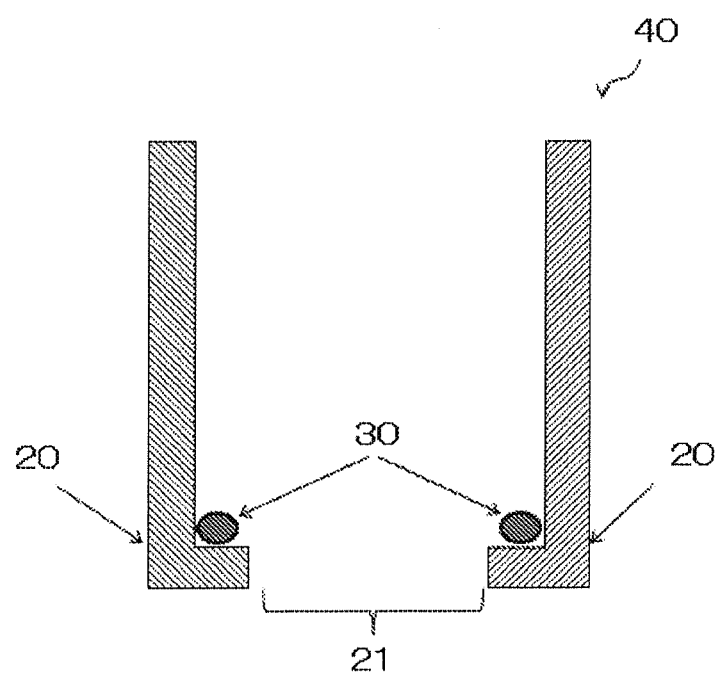
FIG. 4 is a schematic diagram showing an example of an embodiment of an activation chamber 20 of the present invention and a kit 40 that includes the activation chamber 20 and a surface treatment material 30.

FIG. 4 is a schematic diagram showing an example of an embodiment of an activation chamber 20 of the present invention, and a kit 40 that includes the activation chamber 20 and a surface treatment material 30.

In the present invention, the activation chamber 20 means a chamber that can vaporize a surface treatment material, discussed below, when the surface treatment material has been arranged inside, and that can carry out EA surface treatment of a photocathode (material) with the vaporized surface treatment material. The activation chamber 20 of the present invention, when used arranged inside a vacuum chamber, discussed below, allows a single vacuum chamber to be used for EA surface treatment and as an electron-beam source, unlike a conventional EA surface treatment chamber. The activation chamber 20 of the present invention includes at least a hole 21 through which pass electrons emitted from the photocathode. The hole 21 should be of at least a size such that electrons can pass through; for ease of machining and to facilitate adjustment of the angle and positional relationship of the hole 21 and the electrons emitted from the photocathode 52, a size of 1 nm to 10 mm, or a size of 50 μm to 5 mm, is acceptable. A photocathode holder, discussed later, can be inserted into the hole 21 as well, in which case the size of the hole 21 should be such that the photocathode holder can be inserted, and may be larger than the aforementioned numerical ranges.

There are no particular limitations as to the material of the activation chamber 20, which may be formed, for example, of glass, molybdenum, ceramic, sapphire, titanium, tungsten, tantalum, or other heat-resistant material that can withstand temperatures of 300° C. and above, more preferably 400° C. and above.

The kit 40 of the present invention includes at least the activation chamber 20 and the surface treatment material 30. The surface treatment material 30 of the present invention refers to a material for EA surface treatment of a photocathode (material); there are no particular limitations provided that the material can be used in EA surface treatment, and elements such as Li, Na, K, Rb, Cs, Te, Sb, and the like may be cited. Among the aforementioned elements, Li, Na, K, Rb, and Cs in isolation spontaneously combust and cannot be stored or utilized, and it is therefore necessary to use the aforementioned elements in the form of composite elements, or compounds that include the aforementioned elements. On the other hand, when used in compound form, it is necessary to avoid generation of impurity gases during vapor deposition of the aforementioned elements. Consequently, in cases in which an element selected from Li, Na, K, Rb, and Cs is used as the surface treatment material 30, it is preferable to use a combination of a compound such as $Cs_2CrO_4$, $Rb_2CrO_4$, $Na_2CrO_4$, $K_2CrO_4$, or the like, and a reducing agent for suppressing generation of impurity gases. The surface treatment material 30 is vaporized by heating means within the activation chamber 20, and vapor-deposited onto the photocathode (material).

There are no particular limitations as to the heating means, as long as the surface treatment material 30 can be vaporized thereby. The entire activation chamber 20 may be heated to indirectly heat the surface treatment material 30 arranged inside, or the surface treatment material 30 may be heated directly in isolation. As the former method, there may be cited methods such as forming heating means such as an electric coil in the activation chamber 20; or, as discussed below, since the kit of the present invention is used within a vacuum chamber, heating the entire vacuum chamber with an electric coil, lamp heater, or the like, and heating the activation chamber 20 inside the vacuum chamber to a temperature at which the surface treatment material 30 is vaporized.

Figure 5:
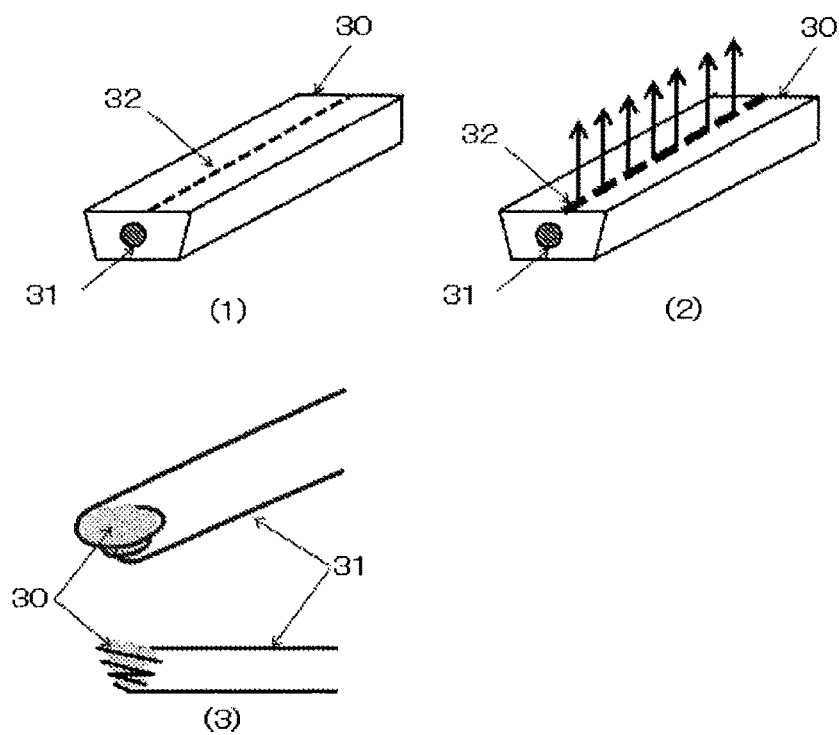
FIG. 5 is a schematic diagram showing an example of a surface treatment material that incorporates heating means.

As the latter method, there may be cited a surface treatment material 30 incorporating heating means, as shown in FIG. 5. FIG. 5 (1) shows an example of heating means 31 incorporated within the surface treatment material 30 into which the heating means 31, such as a heating wire, has been inserted through a center part thereof, the surface treatment material 30 being formed to generally rectangular shape having an incision 32 made in the lengthwise direction. As shown in FIG. 5 (2), the incision 32 is enlarged by heating, and the surface treatment material 30 can be vaporized from the enlarged incision 32, during which process surface treatment material 30 is imparted with directionality from the incision 32 during vaporization, so that the vaporized surface treatment material 30 can be dispersed exclusively in a direction towards the photocathode (material). The surface treatment material 30 shown in FIG. 5 may be formed as described above, or a commercially marketed material may be used. For example, the alkali dispensers made by SAES Getters are known alkali metal materials.

FIG. 5 (3) shows another example of the surface treatment material 30 which incorporates heating means, having a basket part formed by coiling up heating means 31 such as heating wire, into which basket part the surface treatment material 30 is placed, and the heating means 31 is energized, thereby causing the surface treatment material 30 to disperse. In the example shown in FIG. 5 (3), an element that does not combust under spontaneous conditions, and that can be stored and utilized in single-element form, can be used, which is preferable, for example, in cases in which Te or Sb is used as the surface treatment material 30.

The surface treatment material 30 incorporating the heating means 31 may be connected to electrical wiring for energization and arranged within the activation chamber 20, or fitted to a surface treatment material 30 fastening member, not illustrated, that is separate from the activation chamber 20, and inserted into the activation chamber 20 via the fastening member. The fastening member may be formed of a ceramic, sapphire, or other such heat-resistant, insulating material. The surface treatment material 30 placed within the activation chamber 20 may be a single surface treatment material 30 of arbitrary shape or a shape conforming to the shape of the inside of the surface treatment material 20; or a plurality of the surface treatment materials 30 may be arranged at appropriate spacing. In cases in which direction control means for controlling the dispersion direction of the vaporized surface treatment material 30, discussed below, is provided, or in cases in which the surface treatment material 30 shown in FIG. 5 (2) is used, there are no particular limitations as to the position for placing the surface treatment material 30; however, in cases in which direction control means is not provided, placement in the bottom part of the activation chamber 20 is preferred.

Figure 6:
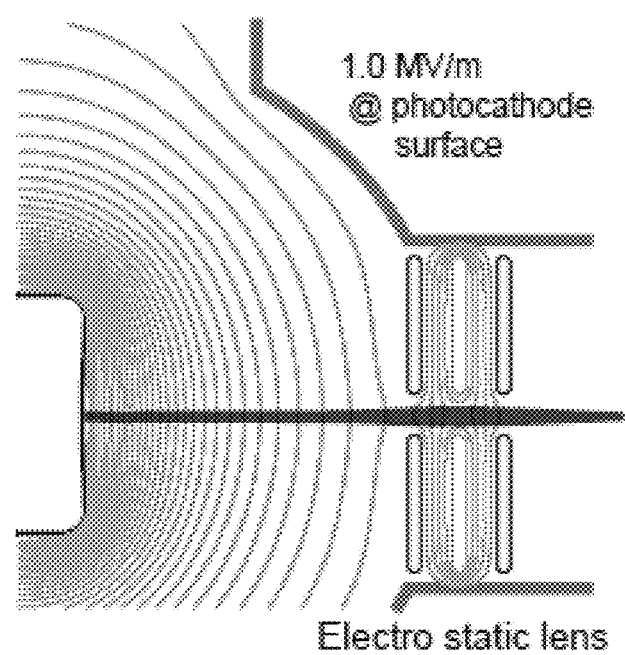
FIG. 6 is a diagram showing an electric field simulation around an electrode.

In addition to use in EA surface treatment of the photocathode (material), the activation chamber 20 can serve as part of the electrode. FIG. 6 shows an electric field simulation diagram around an electrode; an electric field is generated in a section at the end of the electrode in such a way as to wrap around the end portion of the electrode. Typically, it is preferable for the electrical field of the photocathode to be parallel.

Figure 7:
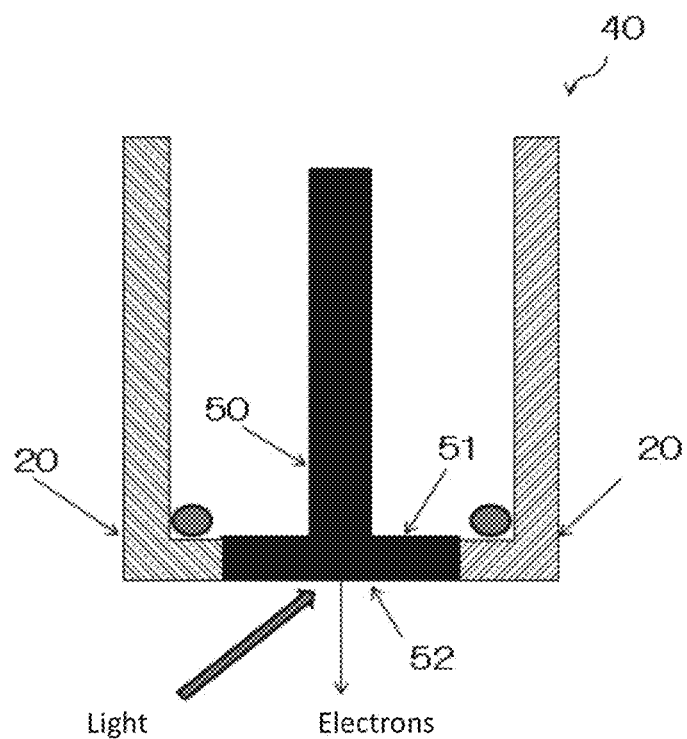
FIG. 7 is a schematic diagram showing an example of positional relationships when a photocathode holder 51 is inserted into a hole 21 of the activation chamber 20 of the present invention.

FIG. 7 is a schematic diagram showing an example of positional relationships when a photocathode holder 51 is inserted into a hole 21 of the activation chamber 20 of the present invention. The photocathode 52 shown in FIG. 7 is attached to a surface of the photocathode holder 51 provided at the distal end of a photocathode rod 50, which surface lies on the opposite side from the photocathode rod 50. The size of the photocathode 52 attached to the photocathode holder 51 may be adjusted, as appropriate. The photocathode holder 51 is inserted into the hole 21 formed in the activation chamber 20, doing so in such a way that the photocathode 52 is not exposed to the outside; in cases in which the photocathode 52 and the activation chamber 20 are integrated into the electrode, the electrical current can wrap around to produce a parallel electrical current near the photocathode 52 at the end part of the activation chamber 20. In cases in which the activation chamber 20 constitutes part of the electrode, because electrical continuity with the photocathode 52 is necessary, it is necessary for the activation chamber 20 to be formed of conductive material, and materials such as molybdenum, titanium, tungsten, tantalum, and stainless steel may be cited. In cases in which the activation chamber 20 is not used as part of the electrode, the activation chamber 20 may be formed from an insulating material, and materials such as glass, ceramic, and sapphire may be cited.

Figure 8:
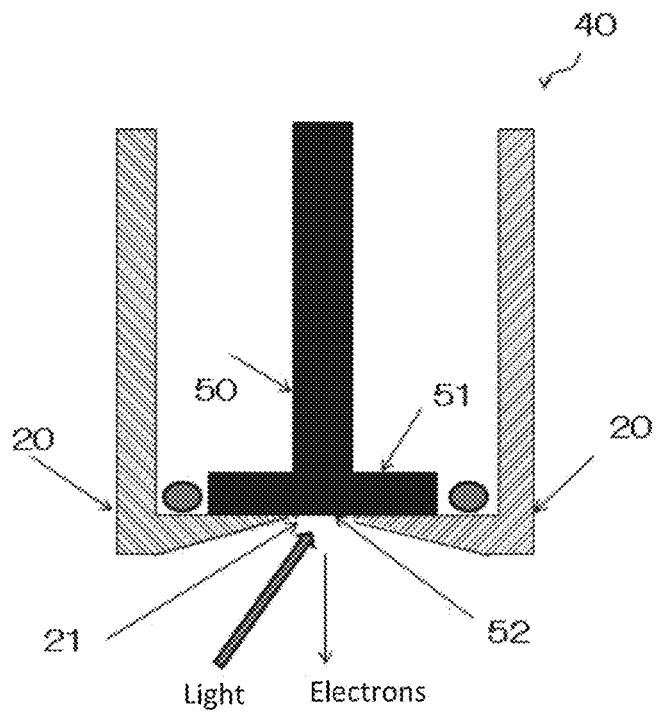
FIG. 8 is a diagram showing another embodiment of the relationship of the photocathode holder 51 and the hole 21 made in the activation chamber 20.

FIG. 8 is a diagram showing another embodiment of the relationship of the photocathode holder 51 and the hole 21 made in the activation chamber 20. In the present embodiment, the photocathode holder 51 is not inserted into the hole 21; instead, the photocathode 52 attached to the photocathode holder 51 is arranged in a portion of the activation chamber 20 where the hole 21 is located. In the case of the present embodiment, the hole 21 should be of a size such that electrons can pass through, and as mentioned previously, for ease of machining and to facilitate adjustment of the angle and positional relationship of the hole 21 and the electrons emitted from the photocathode 52, a size of 1 nm to 10 mm, or a size of 50 μm to 5 mm, is acceptable. In some instances light will irradiate the photocathode 52 on the diagonal, and in order to increase the prospective angle of irradiation and permit irradiation by light from a wider angular range, the bottom part of the activation chamber 20 may be given a tapered shape of decreasing thickness towards the hole 21. The taper angle may be adjusted, as appropriate, depending on the size of the hole 21 and the incidence angle of the light.

The activation chamber 20 may be formed by melting the aforementioned material, which is then flowed into a casting mold, or by machining through cutting. There are no particular limitations as to the shape of the activation chamber 20 provided that the photocathode holder 51 can be arranged within the activation chamber 20; a round tube shape, polygonal tube shape, or the like may be selected, as appropriate.

Figure 9:
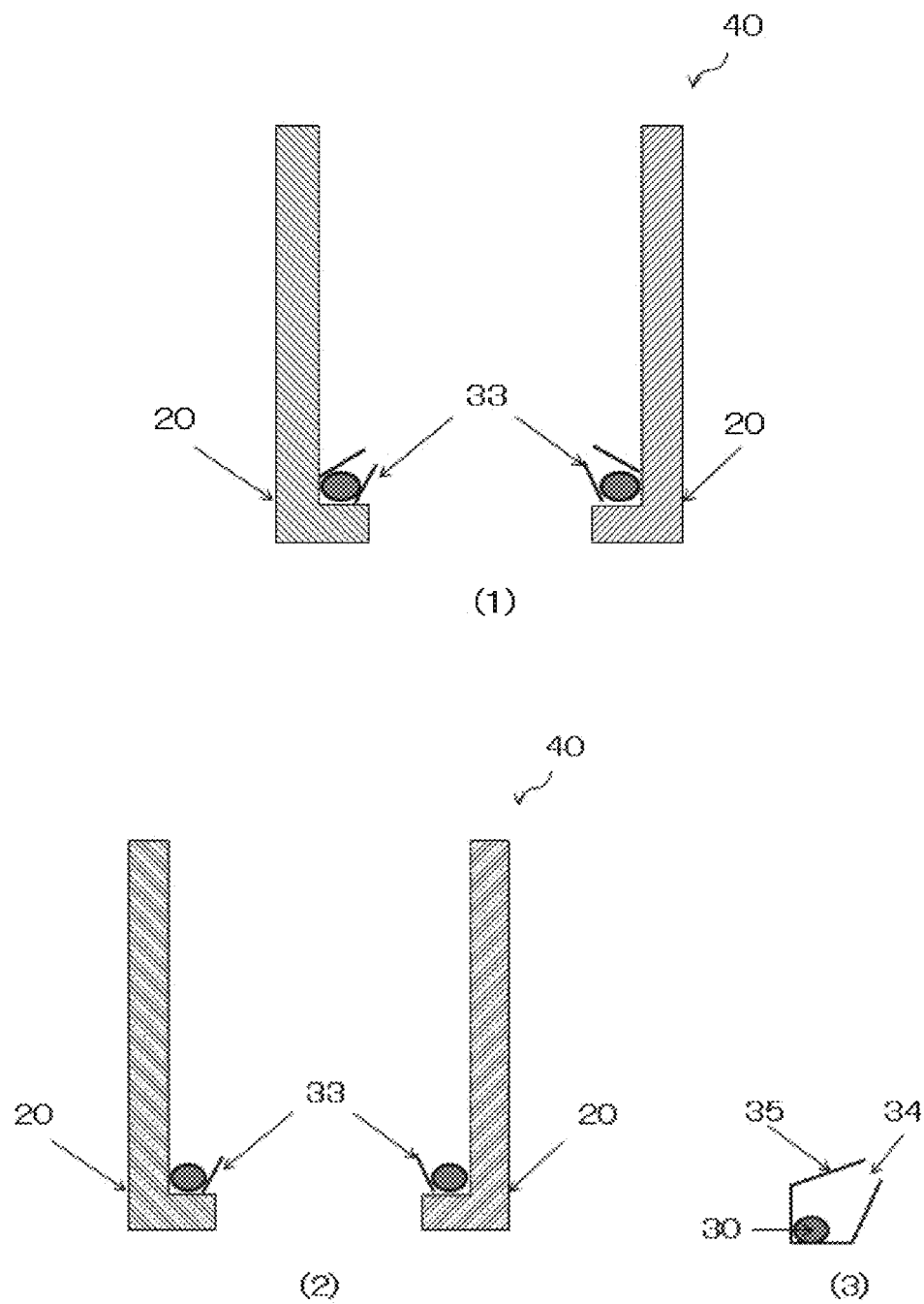
FIG. 9 shows an example of direction control means provided to an activation chamber.

Direction control means for controlling the direction of dispersion of the vaporized surface treatment material 30 may be formed in the activation chamber 20. FIG. 9 shows examples of direction control means; in FIG. 9 (1), for example, two directional control plates 33 are formed so as to sandwich the surface treatment material 30, so that the angle of dispersion of the vaporized surface treatment material 30 can be adjusted to an angle greater than 0°, but less than 90°, with respect to a plane connecting the ends of the hole 21. In cases in which the size of the photocathode holder 51 is substantially identical to the size of the inside of the activation chamber 20, a single direction control plate 33 like that shown in FIG. 9 (2) is acceptable. The direction control plate 33 may be fabricated simultaneously during fabrication of the activation chamber 20, or fabricated separately and fastened by welding or the like.

FIG. 9 (3) shows another embodiment of direction control means in which the direction control plates 33 are replaced by a receptacle 35 fabricated to have an opening 34 that opens towards one direction only, and arranged by welding or the like in the activation chamber 20. The shape of the opening 34, like the direction control plates 33, may be adjusted as appropriate, so that the angle of dispersion from the opening 34 is greater than 0° and less than 90°. The direction control plates 33 and the receptacle 35 may be fabricated of the same material as that used for the activation chamber 20, or of different material. It is acceptable for the surface treatment material 30 arranged inside the direction control means to be the aforementioned surface treatment material 30 incorporating the heating means 31; it is also acceptable to arrange the surface treatment material 30 only. In cases of arranging the surface treatment material 30 only, it is acceptable to heat the entire activation chamber 20, or to arrange heating means, such as heating wire, beforehand in the section where the surface treatment material 30 is to be arranged.

There are no particular limitations as to the photocathode material for forming the photocathode 52 provided that EA surface treatment can be accomplished, and there may be cited, for example, Group III-V semiconductor materials and Group II-V semiconductor materials. Specifically, AlN, $Ce_2Te$, GaN, $K_2CsSb$, AlAs, GaP, GaAs, GaSb, InAs, and the like may be cited. Metals may be cited as another example. Specifically, Mg, Cu, Nb, $LaB_6$, Ag, and the like may be cited. The photocathode 52 can be fabricated through EA surface treatment of the photocathode material, and through selection of the structure and material of the semiconductor material for the photocathode 52, it is possible not only to select the electron-excitation light from within a near-ultraviolet to infrared wavelength region depending on the gap energy of the semiconductor, but also to select the electron-beam source capabilities (quantum yield, durability, monochromaticity, temporal response, and spin polarization) depending on the electron beam application. In so doing, is it possible to generate a beam of unprecedentedly high performance, using not just a high-output (watt-class), high-frequency (hundreds of MHz), short pulse (hundreds of femtoseconds) laser, but also a relatively inexpensive laser diode, as the light source employed for electron excitation.

Moreover, the photocathode holder 51 to which the photocathode 52 is attached can be fabricated from molybdenum, titanium, tantalum, stainless steel, or the like. The photocathode rod 50 can be fabricated from molybdenum, titanium, tantalum, stainless steel, or the like. The kit 40 of the present invention may include the photocathode holder 51 to which the photocathode material is attached, and the photocathode rod 50.

Figure 10:
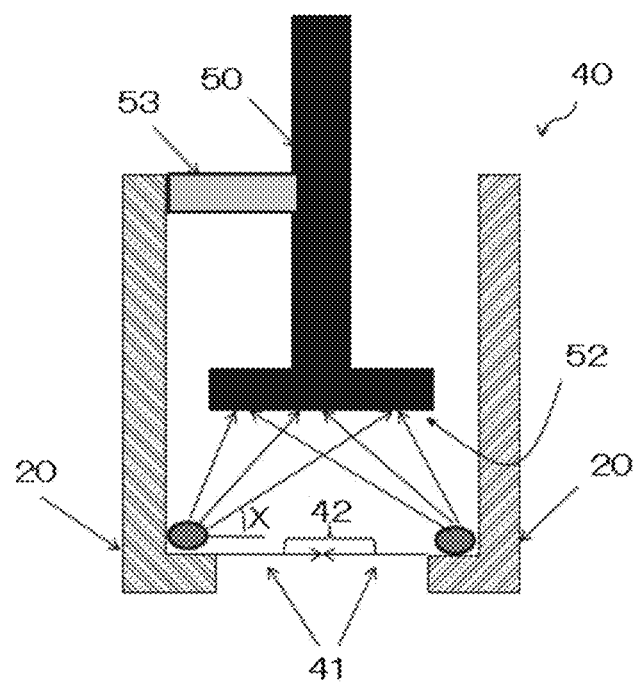
FIG. 10 is a diagram showing the scheme of a positional relationship during EA surface treatment of a photocathode (material) using the kit 40 of the present invention.

FIG. 10 is a diagram showing the scheme of a positional relationship during EA surface treatment using the kit 40 of the present invention. For example, from the position at which the photocathode holder 51 is inserted into the hole 21 of the activation chamber 20, shown in FIG. 7, the photocathode holder 51 is pulled up inside the activation chamber 20 by photocathode driving means 53 as shown in FIG. 10, and the photocathode (material) 52 attached to the photocathode holder 51 is positioned inside the activation chamber 20. In the example shown in FIG. 10, the photocathode driving means 53 is formed in the activation chamber 20; however, provided that the position of the photocathode (material) 52 can be changed, there are no particular limitations as to the location of the driving means, which may be installed separately from the kit 40, such as in a vacuum chamber, discussed below. Provided that the photocathode driving means 53 is able to change the position of the photocathode (material) 52 attached to the photocathode holder 51, either the photocathode rod 50 or the photocathode holder 51 may be driven. The are no particular limitations as to the photocathode driving means 53, provided that the position of the photocathode (material) 52 can be changed thereby, and a motor or other such known drive means may be used.

In preferred practice, the position of the photocathode (material) 52 in the interior of the activation chamber 20 during EA surface treatment will be adjusted with consideration to the direction and range of dispersion of the surface treatment material 30, and to the size of the photocathode (material) 52 attached to the photocathode holder 51, in such a way that the surface treatment material 30 can be vapor-deposited onto the photocathode (material) 52. After the photocathode (material) 52 has been pulled up inside the activation chamber 20, the hole 21 enters an open state. At this time, when the angle 42 formed a line 41 extending from one bottom surface part of the hole 21 of the activation chamber 20 and a line 41 extending from the other bottom surface part is equal to 180° or greater, the bottom surface section itself can control the dispersion of the surface treatment material 30 to a direction inside the activation chamber 20, which is preferable because the vaporized surface treatment material 30 can be prevented from leaking. For efficiency of vapor deposition onto the photocathode (material) 52, and to make it even more difficult for the surface treatment material 30 leaking out from the hole 21 to leak out, the angle 42 of the bottom surface is preferably 210° or greater. The angle of the bottom surface refers to the angle in the case in which no direction control means is used, or the surface treatment material 30 lacks inserted heating means 31 and no incision 32 is formed therein; in the case in which direction control means is provided, or the surface treatment material 30 has inserted heating means 31 and an incision 32 formed therein, there are no particular limitations as to the position at which the surface treatment material 30 is arranged or as to the angle of the bottom surface portions, and as shown in FIG. 10, it is preferable for the surface treatment material 30 to be vaporized and dispersed towards a direction such that the angle X of dispersion of the surface treatment material 30 with respect to a line spanning between the surface treatment material 30 and the surface treatment material 30 is 0° or greater, and preferably 15° or greater.

Meanwhile, when the size of the inside of the activation chamber 20 and the size of the photocathode holder 51 are substantially identical, leakage of the surface treatment material 30 from the top is extremely minimal, and therefore the upper limit of the angle of vaporization and dispersion should be about 90°, and may be adjusted as appropriate, with consideration to the size of the inside of the activation chamber 20, and to the size of the photocathode (material) 52 to be attached to or previously attached to the photocathode holder 51.

Figure 11:
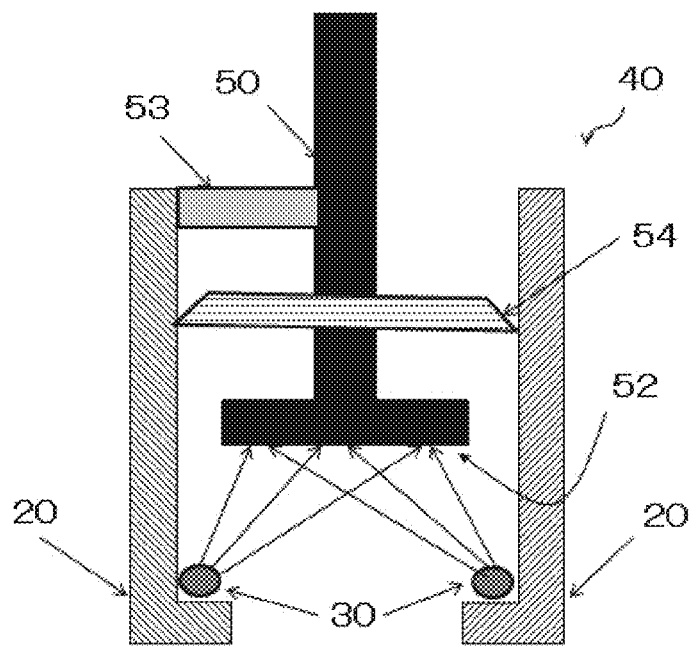
FIG. 11 is a diagram showing an example in which a photocathode rod 50 is furnished with a shield 54.

In cases in which leakage of the surface treatment material 30 from the top part of the activation chamber 20 is to be reduced further, a shield may be provided, in addition to adjusting the dispersion direction of the surface treatment material 30. FIG. 11 shows an example in which the photocathode rod 50 is provided with a shield 54; the shape of the shield 54 is identical to the shape of the inside of the activation chamber 20.

Figure 12:
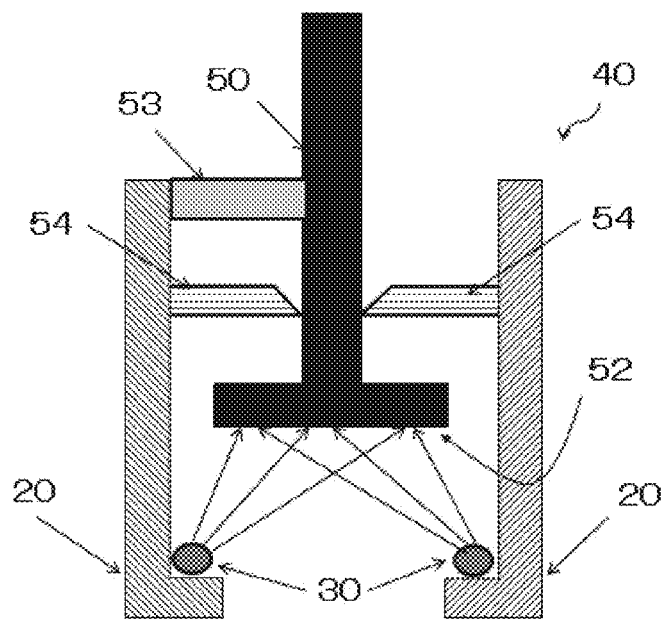
FIG. 12 is a diagram showing an example in which an activation chamber 20 is furnished with a shield 54.

FIG. 12 shows an example in which the activation chamber 20 is provided with a shield 54. A hole of the same size as the photocathode rod 50 is formed in the shield 54. The shield 54 may be formed, for example, of material such as glass, molybdenum, ceramic, sapphire, titanium, tungsten, or tantalum.

In the present invention, through adjustment of the angle of the bottom portions of the activation chamber 20, and/or control of the dispersion direction of the surface treatment material 30, and/or provision of a shield in the manner described above, most of the surface treatment material 30 that has not been vapor-deposited onto the photocathode (material) 52 becomes vapor-deposited onto the inner wall of the chamber 20, and substantially none of the surface treatment material 30 leaks out into the vacuum chamber through the hole 21. Consequently, the surface treatment material 30 is not deposited onto the outside peripheral portions of the activation chamber 20, and therefore the occurrence of field emission dark current and the like can be prevented.

Figure 13:
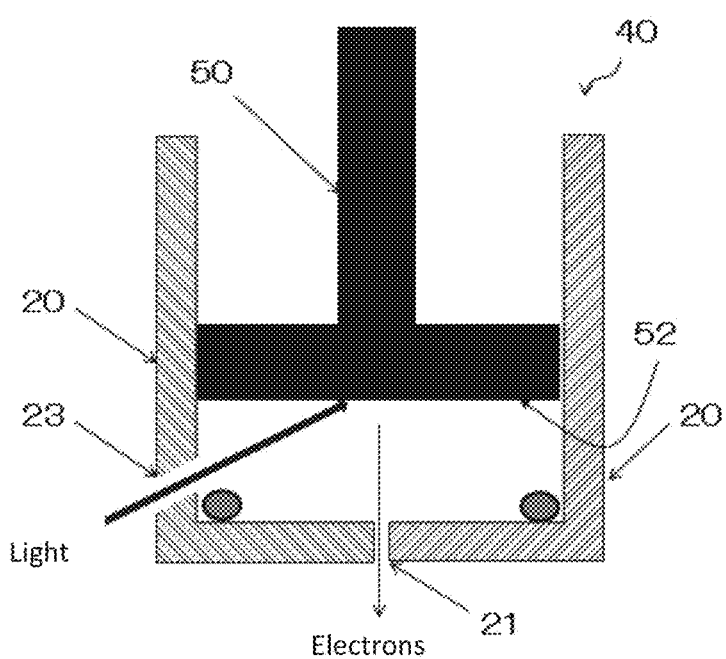
FIG. 13 is a schematic diagram showing another embodiment of the kit 40 of the present invention.

FIG. 13 is a schematic diagram showing another embodiment of the kit 40 of the present invention. In the kit 40 of the present embodiment, a hole 23 for passage of light from a light source is formed in the activation chamber 20, in addition to the hole 21. In the case of the kit of the present embodiment, once the angle of the hole 23, i.e., the incidence angle of light, and the dispersion direction of the surface treatment material 30 have been adjusted, EA surface treatment and emission of electrons can be accomplished without moving the photocathode (material) 52, but, as shall be apparent, it would be acceptable to furnish photocathode drive means 53 for adjusting the position of the photocathode (material) 52. The hole 23 section can be covered with glass or the like, provided that light can pass through the hole 23. The size of the hole 21 is as described above, and therefore the surface treatment material 30 cannot leak out from the hole 21. In cases in which the photocathode holder 51 used is substantially identical in size to the inside of the activation chamber 20, substantially none of the hole communicates with the outside of the activation chamber 20, and the likelihood that the surface treatment material 30 will leak to the outside of the activation chamber 20 can be reduced further. In the case of the present embodiment, there is substantially no part of the hole through which the surface treatment material 30 can leak to the outside of the activation chamber 20, and therefore it is acceptable to not furnish direction control means for the surface treatment material 30.

Figure 14:
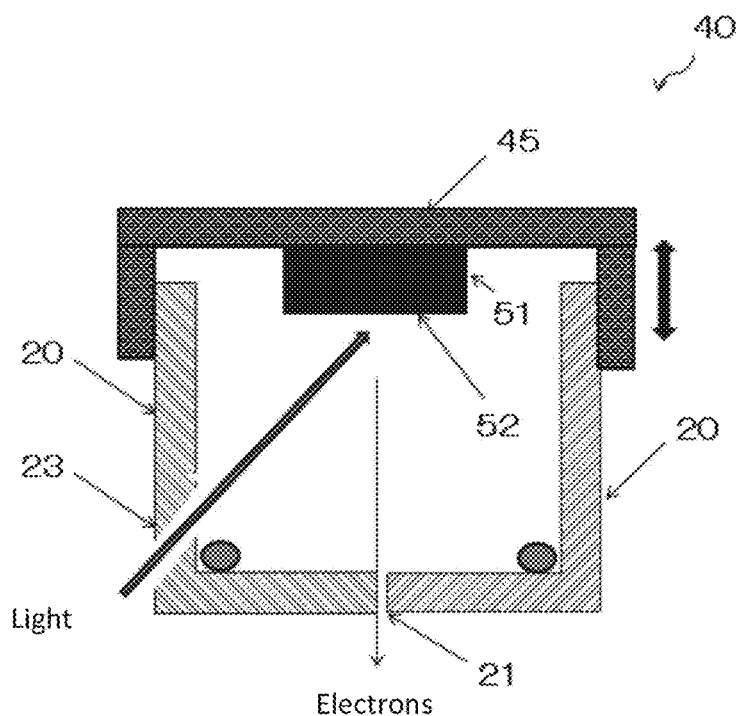
FIG. 14 is a schematic diagram showing another embodiment of the kit 40 of the present invention.

FIG. 14 is a schematic diagram showing another embodiment of the kit 40 of the present invention. In the kit 40 of the present embodiment, a hole 21 and a hole 23 are formed in the same manner as in the embodiment shown in FIG. 13. In the kit of the present embodiment, the photocathode holder 51 is furnished to a lid 45 that is slidable in a substantially hermetic state with respect to the activation chamber 20, and the photocathode (material) 52 is attached to the photocathode holder 51 in a direction facing the interior of the activation chamber 20. In the case of the present embodiment, by adjusting the angle of the hole 23, i.e., the incidence angle of light, and the dispersion direction of the surface treatment material 30, EA surface treatment and electron emission can be accomplished without moving the photocathode (material) 52; however, lid drive means, not shown, for adjusting the position of the lid 45 may be furnished. As with the photocathode drive means 53, the lid drive means may be formed using a motor or the like, and may be formed either in the activation chamber 20 or within the vacuum chamber. The lid 45 may be formed of a material such as glass, molybdenum, ceramic, sapphire, titanium, tungsten, or tantalum. The hole 21 and the hole 23 may be formed in the same manner as in the embodiment shown in FIG. 13.

Figure 15:
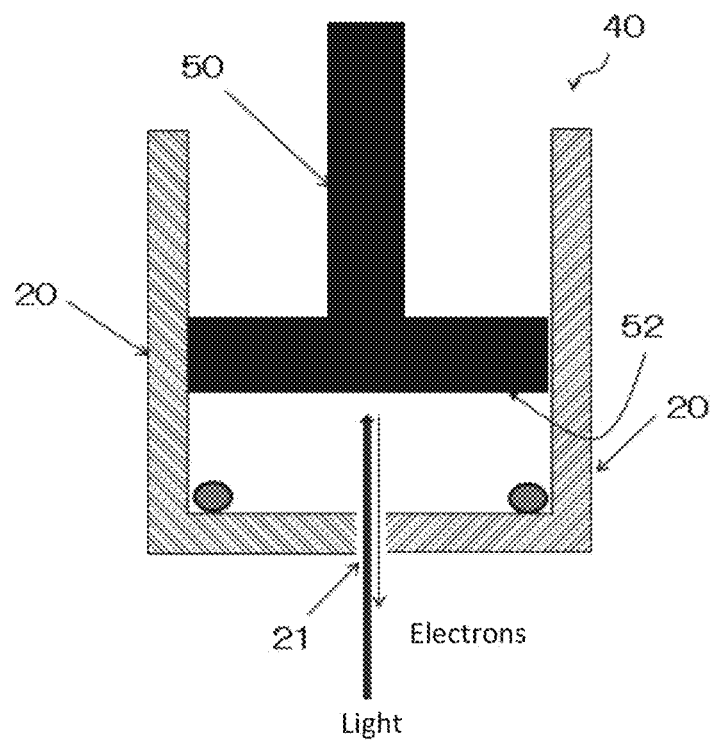
FIG. 15 is a schematic diagram showing another embodiment of the kit 40 of the present invention.

FIG. 15 shows an embodiment in which the same hole is employed as the hole 23 for passage of light from the light source and the hole 21 for passage of electrons in the activation chamber 20 of the embodiment shown in FIG. 13. In the embodiment shown in FIG. 15, light exits from behind an anode, discussed below, and passes through the hole 21, and the electrons emitted from the photocathode 52 due to irradiation of the photocathode 52 with light pass through the hole 21 as well. The size of the hole 21 may be the size described above. In the embodiment shown in FIG. 14, as in the embodiment shown in FIG. 15, the same hole is employed as the hole 23 for passage of light from the light source and the hole 21 for passage of electrons.

Figure 16:
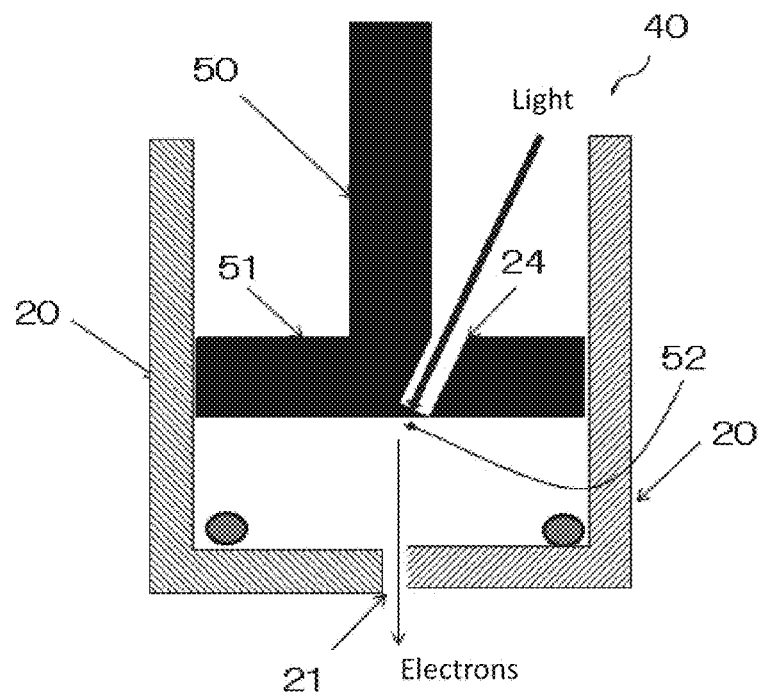
FIG. 16 is a schematic diagram showing another embodiment of the kit 40 of the present invention.

FIG. 16 shows an example in which the activation chamber 20 of the embodiment shown in FIG. 13 is furnished with a hole 24 permitting irradiation of the photocathode holder 51 with light, in lieu of the hole 23 for irradiating the photocathode 52 with light from a light source. In the embodiment shown in FIG. 16, light strikes the photocathode 52 from the side of the photocathode holder 51 at which the photocathode is not attached (the direction of the photocathode rod 50), so that electrons can be emitted. In the case of the present embodiment, light having passed through the photocathode holder 51 must further pass through a substrate, furnished between the photocathode holder 51 and the photocathode 52, for fabrication of a semiconductor element of the photocathode 52, to reach the photocathode 52. Consequently, the substrate must either be formed of a light-transmissive material such as sapphire, or a hole for passage of light must be formed in the substrate. While the aforementioned substrate is needed in cases in which a semiconductor material is used as the photocathode material, it will not be necessary in cases in which a metal material is used as the photocathode material. In the example shown in FIG. 16, the hole 24 is formed in the photocathode holder 51, but in cases in which the photocathode holder 51 is formed, for example, using a light-transmissive material such as sapphire, there is no need to form the hole 24. In the embodiment shown in FIG. 14, as in the embodiment shown in FIG. 16, the hole 24 may be formed in the lid 45 and in the photocathode holder 51, or the lid 45 and the photocathode holder 51 may be fabricated using a light-transmissive material. Further, the substrate for the purpose of fabricating a semiconductor element of the photocathode 52 may be formed from a light-transmissive material, or a hole for passage of light may be formed in the substrate.

Figure 17:
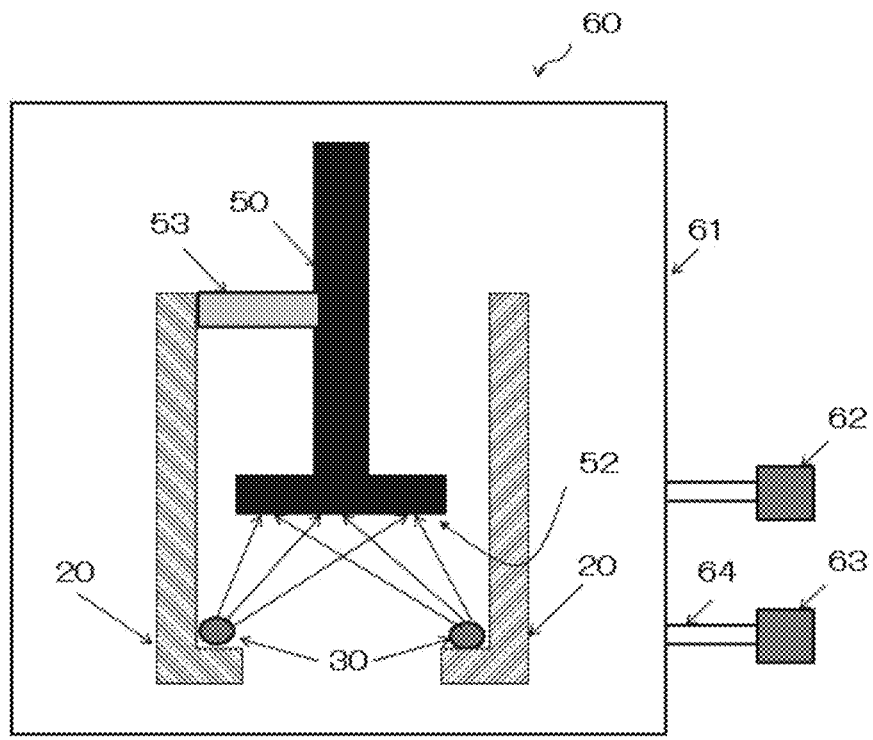
FIG. 17 is a schematic diagram showing an example of the treatment device 60 of the present invention.

FIG. 17 is a schematic diagram showing an example of a treatment device 60 of the present invention. The treatment device 60 of the present invention includes the aforementioned kit 40, arranged within a vacuum chamber 61, and a vacuum pump 62 for bringing the vacuum chamber to a vacuum. A cylinder 63 filled with a gas necessary for EA surface treatment, for example, oxygen, $NF_2$, $N_2$, or the like, depending on the photocathode (material), and a pipe 64 for spraying gas from the cylinder 63 onto the photocathode 52, may be included as well.

Due to the need to carry out EA surface treatment at approximately 600° C. and pressure of $10^{-5}$ Pa or below, a widely known vacuum chamber 61 able to withstand the above conditions, and a vacuum pump 62 that can bring the vacuum chamber 61 to a vacuum state, should be used. As the vacuum chamber 61 there may be cited, for example, a stainless steel chamber, a titanium chamber, or a μ metal chamber; and as the vacuum pump 62, there may be cited, for example, a turbo pump, ion pump, an evaporable getter pump, a non-evaporable getter pump, and the like.

EA surface treatment using the treatment device 60 of the present invention, and EA surface re-treatment of the photocathode 52 after a prescribed time period has passed, can be carried out by the following procedure.

(1) Before being introduced into the vacuum chamber 61, the photocathode holder 51 to which the photocathode material has been attached is covered by impurities in the atmosphere. For this reason, the photocathode holder 51 to which the photocathode material is attached is heated for 10 minutes to one hour at 300-700° C. in a vacuum, and cleaned to remove surface impurities such as oxides, carbides, and the like. The heating temperature and heating time may be adjusted, as appropriate, depending on the photocathode material being used. In so doing, band bending can be produced in the photocathode material, and the vacuum level lowered to about half the bandgap ($\varphi_B$) of the semiconductor forming the photocathode 52.

(2) First, the surface treatment material 30 is vapor-deposited so as to obtain a very small photocurrent on the crystal surface of the photocathode material, followed by deposition of the surface treatment material 30, and optional addition of a gas such as oxygen, $NF_3$, or $N_2$, repeating these alternately until the maximum photocurrent is obtained, for each saturation of photocurrent. By lowering the remaining vacuum level ($\varphi_D$) by this method, an EA surface state can be formed. Addition of a gas may be accomplished by furnishing the gas cylinder 63 to the outside of the vacuum chamber 61, and spraying the gas onto the photocathode material through the pipe 64 from the cylinder 63. In the case of vapor deposition of multiple types of surface treatment material 30, for example, Cs and Te, Cs and Sb, or the like, addition of a gas will be unnecessary.

(3) After electron emission for a given time period, EA surface re-treatment is carried out by carrying out the procedure of (2) above.

Figure 18:
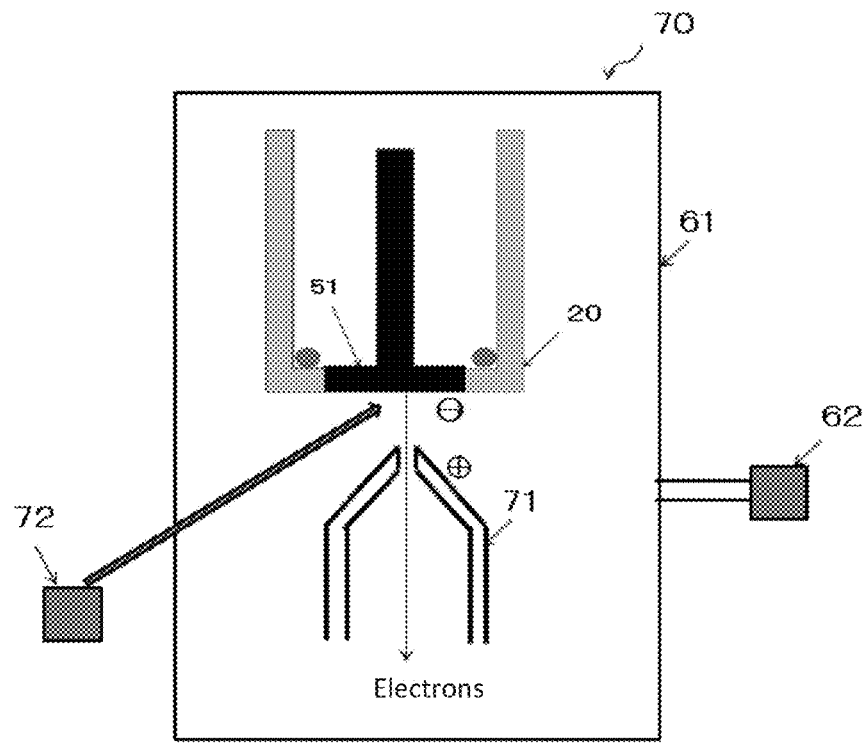
FIG. 18 is a schematic diagram showing an example of the electron-beam source (two electrodes structure) of the present invention.

FIG. 18 is a schematic diagram showing an example of the electron-beam source of the present invention. The electron-beam source of the present invention includes, in addition to the treatment device 60, an anode 71 which is furnished inside the vacuum chamber 61, and a light source 72 which is furnished to the outside of the vacuum chamber 61. The anode 71 is of a known material used in electron guns and the like; for example, titanium, molybdenum, stainless steel, or the like can be used. A light source of known type can be used as the light source 72; laser diodes, pulse lasers, solid-state lasers, gas lasers, and the like may be cited, for example. The irradiating light from the light source 72 merely needs to pass through a light transmission window, not illustrated, that is formed in the vacuum chamber 61, and may be adjusted appropriately so that, in the process, the photocathode 52 can be irradiated at the desired angle by using an optical system (mirror system), not illustrated. As noted above, the light from the light source may pass through the anode 71 to irradiate the photocathode 52.

Figure 19:
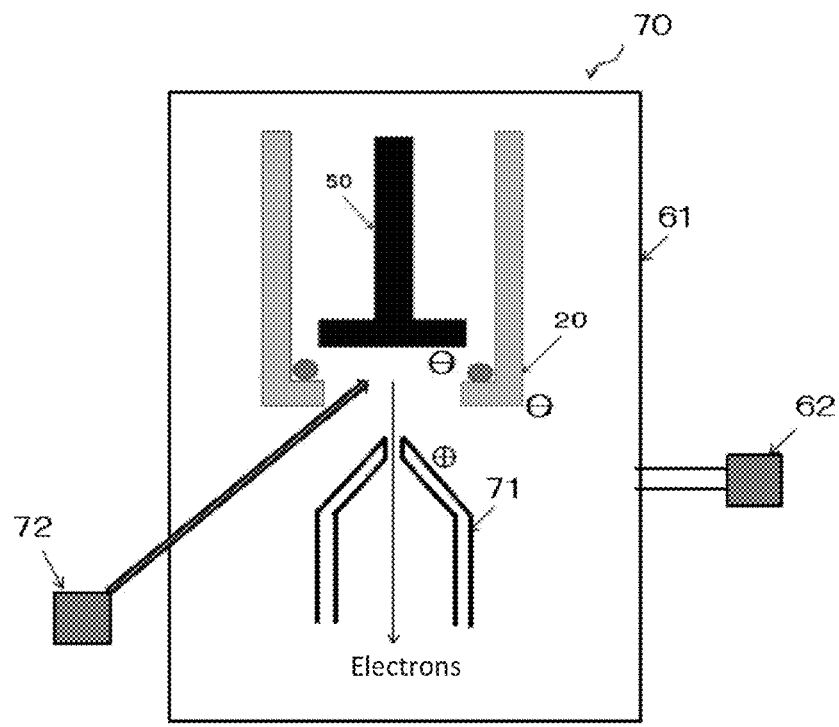
FIG. 19 is a schematic diagram showing an example of the electron-beam source (three electrodes structure) of the present invention.

The example shown in FIG. 18 is an example of a two electrodes structure in which the photocathode is minus and the anode 71 is plus, but could also be used as a three electrodes structure as shown in FIG. 19, in which the activation chamber 20 is formed from a conductive material, and the photocathode 52 is used in a state of non-contact with the activation chamber 20. In the case of using the three electrodes structure, the voltage $V_A$ of the photocathode 52 and the voltage $V_B$ of the activation chamber 20 should be such that $V_A \neq V_B$, and both $V_A$ and $V_B$ are 0 V or lower.

With the two electrodes structure shown in FIG. 18, the electrical field intensity can be maximized, and therefore a large current value can be obtained, and spreading of the electrons can be restrained. This is accordingly useful in applications requiring large current, for example, an electron-beam source for an accelerator or the like. With the three electrodes structure shown in FIG. 19, on the other hand, the current can be stabilized, and the spread of electrons can be adjusted. This is accordingly useful as an electron-beam source in an electron microscope, electron-beam lithography device, or the like.

In the examples disclosed above, EA surface treatment of the photocathode 52 and output of electrons as an electron source are carried out separately; however, it is possible for the electron-beam source using the treatment device of the present invention to re-treat an EA surface without changing the position of the photocathode 52 within the activation chamber 20, and therefore the photocathode 52 can be irradiated with light and electrons output while the surface treatment material 30 is being vapor-deposited onto the photocathode 52. In this case, there is no need to suspend output of electrons in order to re-treat the EA surface, making continuous operation for a prolonged period possible.

The electron-beam source 70 of the present invention obviates the need for an EA surface treatment chamber and transport means to transport the photocathode as were required with conventional electron-beam sources, allowing the device to be smaller in scale. Moreover, an electron-beam source in which the EA surface-treated photocathode is used makes it possible to generate electron beams that not only have high brightness, but are high repetition-frequency, short-pulse or spin-polarized beams of advanced and versatile capacities. Consequently, such sources can be used as electron-beam sources in equipment that uses electron-beam sources of which the aforementioned capabilities have been required in the past, for example, electron guns, free-electron laser accelerators, transmission electron microscopes (TEM), scanning electron microscopes (SEM), electron-beam holography microscopes, electron-beam lithography devices, electron-beam scanning devices, and the like. Further, such sources can be used as electron-beam sources in the field of machining equipment, such as electron-beam lithography devices requiring continuous manipulation, in cases in which simultaneous EA surface treatment and output of electrons is required.

EXAMPLES

Example 1

(Fabrication of Activation Chamber)

Using molybdenum as the material, an activation chamber was formed by cutting and surface polishing. The bottom surface was circular with a diameter of 68 mm, and the hole diameter was 11 mm.

(Fabrication of Kit)

Example 2

(Fabrication of Fastening Member Having Surface Treatment Materials Fitted to Distal End)

Figure 20:
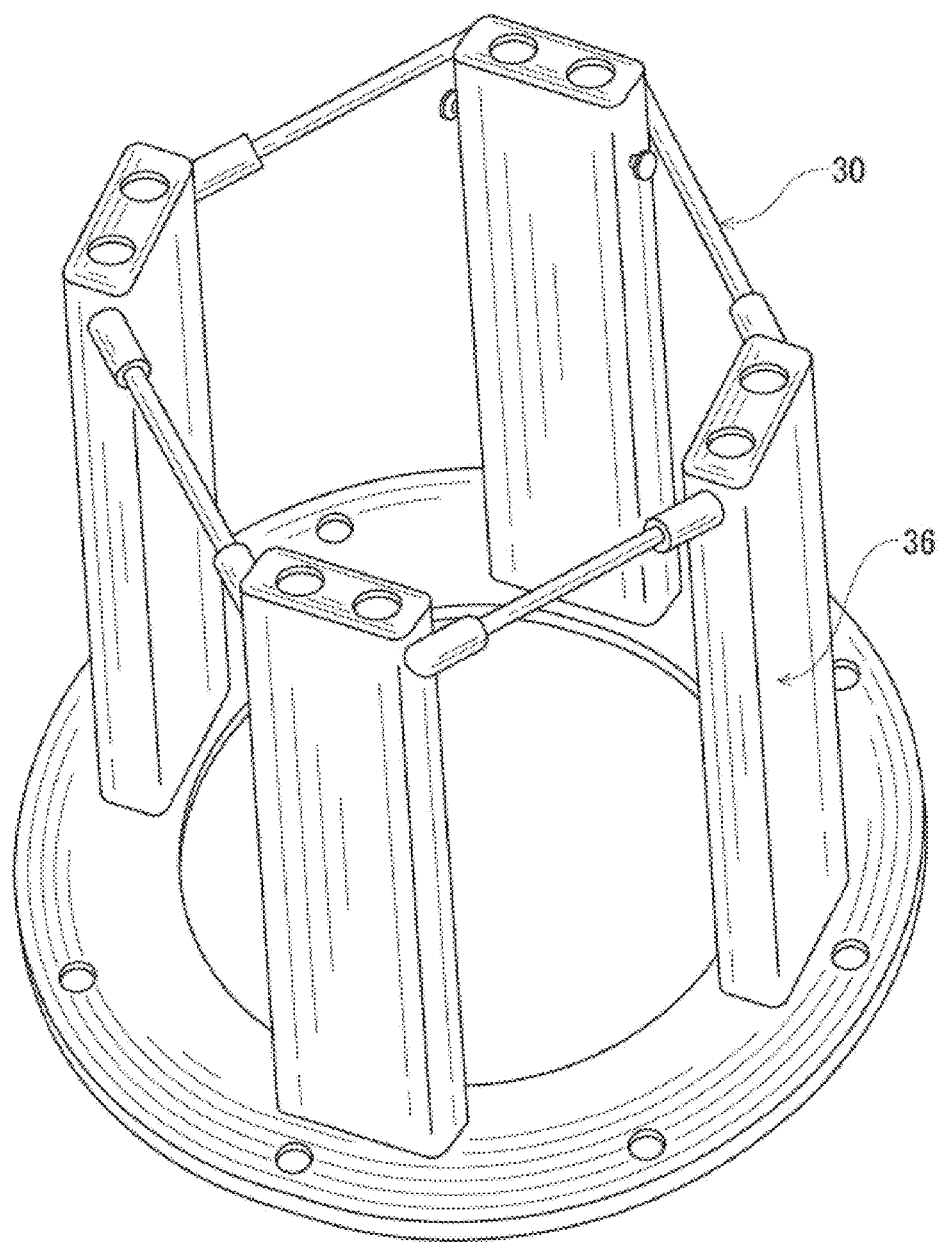
FIG. 20 is a photo in lieu of a drawing, and shows the outward appearance of a fastening member having the surface treatment materials fabricated in Example 2 fitted to the distal end.

To the distal end of a ceramic fastening member 36 fabricated by cutting and hardening were fitted four surface treatment materials 30 (made by SAE Getters) of $Cs_2CrO_4$ having heating wiring inserted through the center. Silver electrical wire for energizing and heating the heating wiring was wired inside the fastening member 36. FIG. 20 is a photo showing the outward appearance of a fastening member having the fabricated surface treatment materials fitted to the distal end.

(Fabrication of Photocathode Rod, and Photocathode Holder with Photocathode Material Attached)

The photocathode rod 50 was fabricated from titanium. The photocathode holder 51 was fabricated from molybdenum, and was approximately 34 mm in diameter. Next, a sapphire substrate on which a GaN semiconductor was grown was attached to the molybdenum with melted indium, to produce the photocathode holder 51 with the photocathode material attached.

Figure 21:
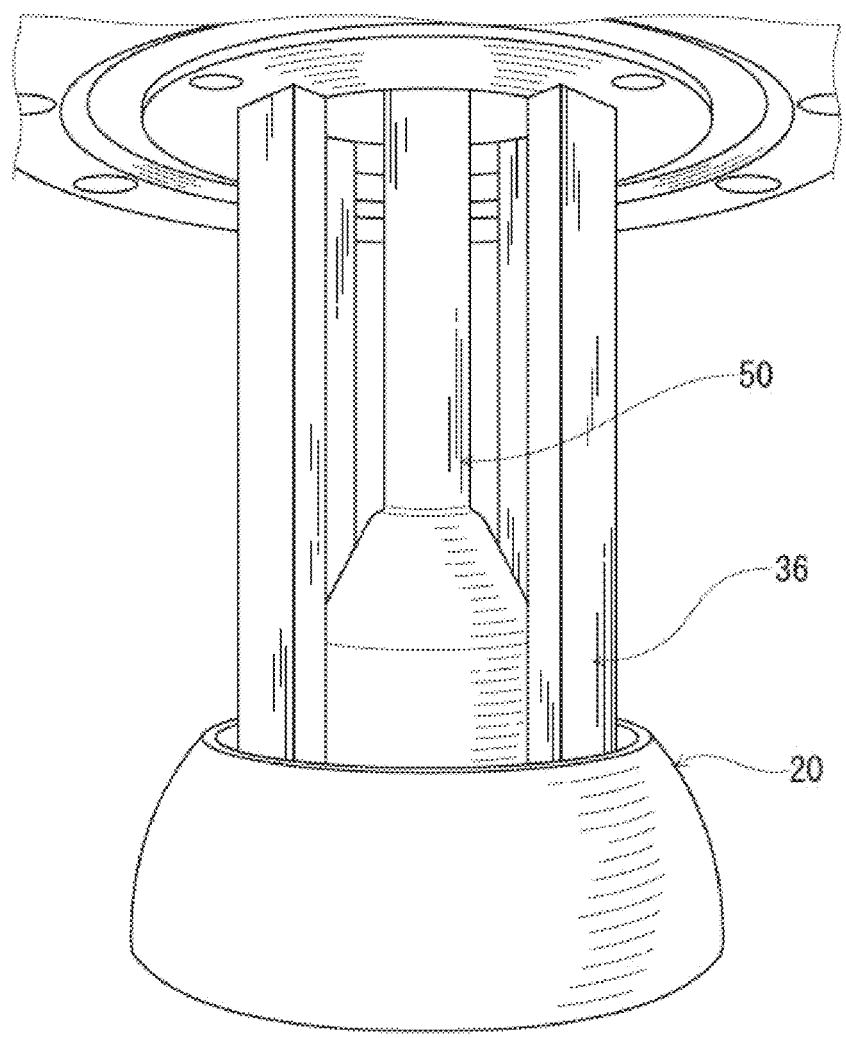
FIG. 21 is a photo in lieu of a drawing, and shows the outward appearance of the kit fabricated in Example 2.

The fastening member 36 to which the surface treatment material 30 was fitted, and the photocathode holder 51 furnished to the distal end of the photocathode rod 50 and having the photocathode material attached, were inserted into the activation chamber 20 fabricated in Example 1, to fabricate a kit. FIG. 21 is a photo showing the outward appearance of the kit fabricated in Example 2.

(Fabrication of Photocathode)

Example 3

The kit fabricated in Example 2 was placed inside a vacuum chamber (Spherical Chamber made by Kimball Physics Inc.). Using a ribbon heater as heating means, the interior of the vacuum chamber was evacuated to $10^{-9}$ Pa by a vacuum pump (an ion pump made by ULVAC, or a non-evaporable getter pump made by SAES Getter), and evacuated to an ultrahigh vacuum state. The photocathode material was heated for 1 hour at approximately 550° C., removing surface impurities such as oxides and carbides. Next, a fastening member with the surface treatment material fabricated in Example 2 fitted to the distal end was energized and heated to approximately 600° C., vaporizing the surface treatment material, and Cs was vapor-deposited onto the surface of the photocathode material for 10 minutes, followed by spraying oxygen (99.999%) onto the photocathode material for 2 minutes. Spraying of the surface treatment material and the oxygen was carried out five times to carry out EA surface treatment of the photocathode material and fabricate the photocathode 52.

Figure 22:
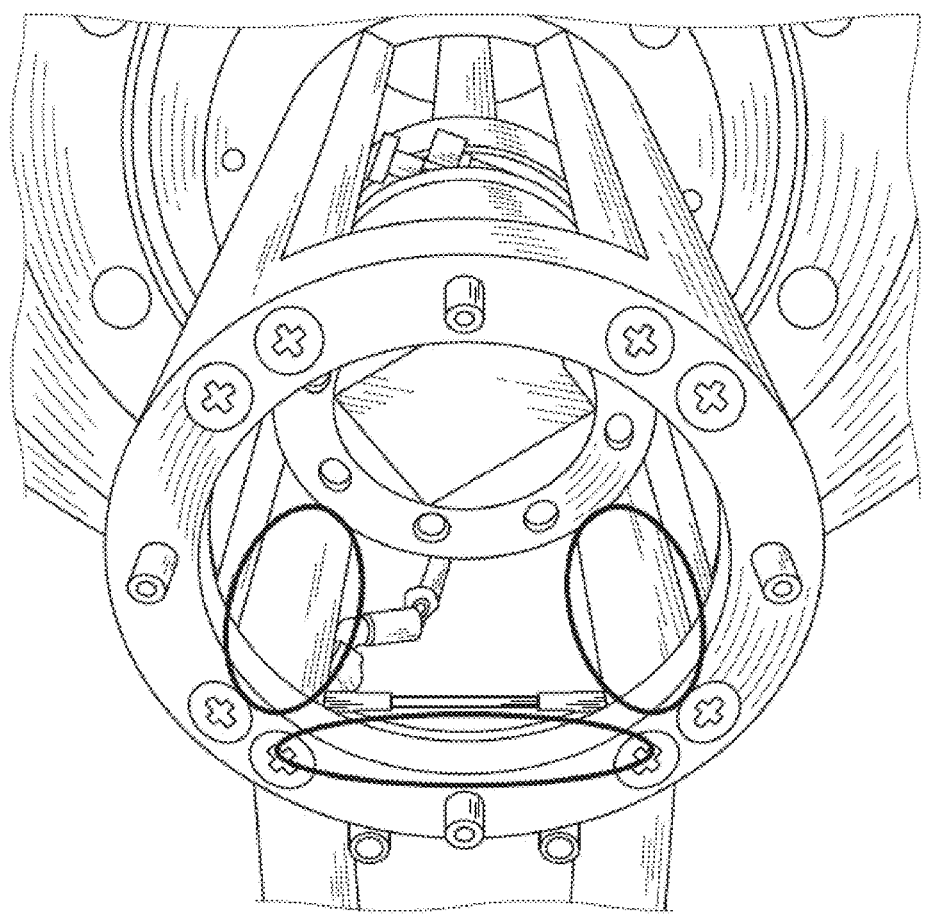
FIG. 22 is a photo in lieu of a drawing, taken of the photocathode 52 that was fabricated in Example 3, from the photocathode side thereof after detaching the vacuum chamber and the activation chamber.

FIG. 22 is a photo of the fastening member and the photocathode holder 51 with the photocathode 52 attached, taken from the photocathode 52 side after fabricating the photocathode 52 in Example 3, with the photocathode holder 51 still in the position for EA surface treatment (the position shown in FIG. 10 and FIG. 21), and with the vacuum chamber and the activation chamber detached. As will be understood from FIG. 22, vapor deposition of cesium onto the inside of the fastening member (in the photograph, the grayish-yellow sections surrounded by ovals) was confirmed. It was found that, with the activation chamber of the present invention, cesium that, of the vaporized cesium, was not vapor-deposited onto the photocathode (material) became attached to the activation chamber interior, thereby substantially suppressing envelopment of the activation chamber exterior by the cesium.

(EA Surface Re-Treatment of Photocathode)

Example 4

Figure 23:
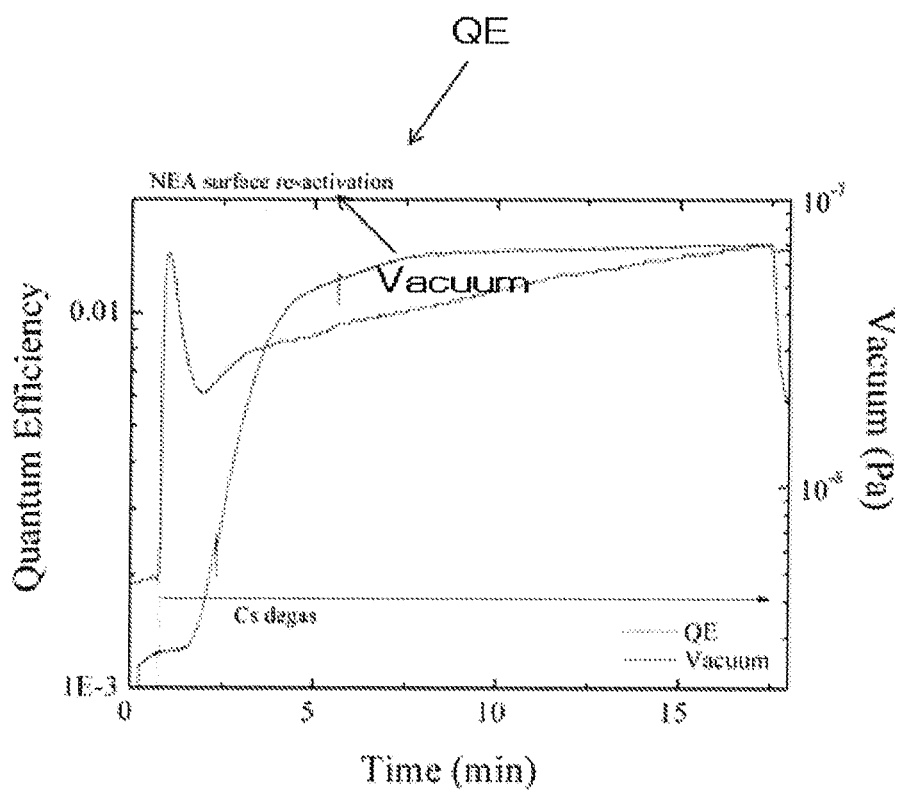
FIG. 23 is a graph showing the extent of recovery of quantum efficiency during EA surface re-treatment of the photocathode in Example 4.

A photocathode having undergone surface degradation due to photoirradiation (a decline in quantum efficiency of about two orders of magnitude) was subjected to re-treatment of the EA surface by the same procedure as in Example 3, except for omitting the procedure to remove surface impurities such as oxides and carbides in Example 3. FIG. 23 is a diagram showing EA surface re-treatment time and the extent of recovery of quantum efficiency. Quantum efficiency was derived through measurement of the output of irradiating light and the photocurrent. As will be understood from FIG. 23, it was confirmed that the quantum efficiency recovered concomitantly with commencement of EA surface re-treatment.

What is claimed is:

1. An activation chamber disposed inside a treatment device for lowering electron affinity for vaporizing a surface treatment material and using the vaporized surface treatment material to perform a treatment to lower electron affinity on a photocathode material and/or re-treatment to lower electron affinity on a photocathode,
   wherein the activation chamber is disposed inside a vacuum chamber of the treatment device for lowering electron affinity and includes a hole through which electrons pass, and the activation chamber itself is not a vacuum chamber.

2. The activation chamber according to claim 1, wherein the activation chamber is formed of a material selected from conductive materials, and insulating materials.

3. The activation chamber according to claim 1, further comprising drive means which is formed in the activation chamber for changing the position of a photocathode holder.

4. The activation chamber according to claim 3, wherein the hole is large enough to allow the photocathode holder to be inserted therein.

5. The activation chamber according to claim 1, further comprising direction control means for controlling the dispersion direction of vaporized surface treatment material.

6. The activation chamber according to claim 1, further comprising heating means for heating the surface treatment material.

7. The activation chamber according to claim 1, further comprising a shield for preventing vaporized surface treatment material from leaking outside the activation chamber.

8. A kit for lowering electron affinity, comprising:
   the activation chamber according to claim 1; and
   a surface treatment material.

9. The kit according to claim 8, wherein the surface treatment material has heating means inserted therein.

10. The kit according to claim 8, further comprising a photocathode holder with the photocathode or a photocathode material attached.

11. The kit according to claim 10, further comprising a photocathode rod on which is formed a shield for preventing vaporized surface treatment material from leaking outside the activation chamber.

12. The kit according to claim 10, further comprising a lid that is slidable with respect to the activation chamber,
   wherein the photocathode holder with the photocathode or the photocathode material attached is formed on the lid.

13. A treatment device for lowering electron affinity, comprising:
   the kit according to claim 8;
   a vacuum chamber; and
   a vacuum pump.

14. A photocathode electron-beam source comprising:
   the treatment device for lowering electron affinity according to claim 13;
   an anode; and
   a light source.

15. An electron gun comprising the photocathode electron-beam source according to claim 14.

16. A free-electron laser accelerator comprising the photocathode electron-beam source according to claim 14.

17. A transmission electron microscope comprising the photocathode electron-beam source according to claim 14.

18. A scanning electron microscope comprising the photocathode electron-beam source according to claim 14.

19. An electron-beam holography microscope comprising the photocathode electron-beam source according to claim 14.

20. An electron-beam lithography device comprising the photocathode electron-beam source according to claim 14.

21. An electron-beam diffraction device comprising the photocathode electron-beam source according to claim 14.

22. An electron-beam scanning device comprising the photocathode electron-beam source according to claim 14.

23. An activation chamber for use in a treatment device for lowering electron affinity for vaporizing a surface treatment material and using the vaporized surface treatment material to perform a treatment to lower electron affinity on a photocathode material and/or re-treatment to lower electron affinity on a photocathode,
wherein the activation chamber is used in a vacuum chamber of the treatment device for lowering electron affinity and includes a hole through which electrons pass, and a hole through which light passes, and
the activation chamber itself is not a vacuum chamber.

24. A kit for lowering electron affinity, comprising:
an activation chamber for use in a treatment device for lowering electron affinity for vaporizing a surface treatment material and using the vaporized surface treatment material to perform a treatment to lower electron affinity on a photocathode material and/or re-treatment to lower electron affinity on a photocathode;
the surface treatment material; and
a photocathode holder with the photocathode or a photocathode material attached, wherein:
the activation chamber is used in a vacuum chamber of the treatment device for lowering electron affinity, and includes a hole through which electrons pass,
the activation chamber itself is not a vacuum chamber, and
the photocathode holder is fabricated of light-transmissive material or comprises a hole through which light passes.

25. The kit according to claim 24, further comprising a lid that is slidable with respect to the activation chamber,
wherein the photocathode holder with the photocathode or the photocathode material attached is formed on the lid, and
wherein the lid and the photocathode holder are fabricated of a light-transmissive material or comprise a hole through which light passes.

26. A kit for lowering electron affinity, comprising:
an activation chamber for use in a treatment device for lowering electron affinity for vaporizing a surface treatment material and using the vaporized surface treatment material to perform a treatment to lower electron affinity on a photocathode material and/or re-treatment to lower electron affinity on a photocathode;
the surface treatment material; and
a photocathode holder with the photocathode or a photocathode material attached, wherein:
the activation chamber is used in a vacuum chamber of the treatment device for lowering electron affinity, and includes a hole through which electrons pass,
the activation chamber itself is not a vacuum chamber,
the kit further comprises a substrate between the photocathode material or the photocathode, and the photocathode holder, and
the substrate is fabricated of a light-transmissive material or comprises a hole through which light passes.

27. A treatment device, comprising:
a vacuum chamber; and
an activation chamber disposed in the vacuum chamber, wherein:
the treatment device is for lowering electron affinity for vaporizing a surface treatment material and using the vaporized surface treatment material to perform a treatment to lower electron affinity on a photocathode material and/or re-treatment to lower electron affinity on a photocathode, and
the activation chamber includes a hole through which electrons pass, and the activation chamber itself is not a vacuum chamber.

* * * * *